United States Patent
Park (10) Patent No.: US 8,610,198 B2
(45) Date of Patent: *Dec. 17, 2013

(54) SEMICONDUCTOR DEVICE

(75) Inventor: Sun Mi Park, Seoul (KR)

(73) Assignee: SK hynix Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/545,389

(22) Filed: Jul. 10, 2012

(65) Prior Publication Data

US 2012/0294082 A1 Nov. 22, 2012

Related U.S. Application Data

(62) Division of application No. 12/872,888, filed on Aug. 31, 2010.

(30) Foreign Application Priority Data

Sep. 1, 2009 (KR) .................. 10-2009-0082071

(51) Int. Cl.
*H01L 29/792* (2006.01)
(52) U.S. Cl.
USPC .......................................... 257/324
(58) Field of Classification Search
USPC ................... 365/189.011; 257/E29
See application file for complete search history.

(56) References Cited

U.S. PATENT DOCUMENTS

| 4,065,781 | A | | 12/1977 | Gutknecht | |
|---|---|---|---|---|---|
| 5,179,032 | A | * | 1/1993 | Quigg | 438/268 |
| 2006/0273391 | A1 | | 12/2006 | Diaz et al. | |
| 2007/0063257 | A1 | * | 3/2007 | Hur et al. | 257/315 |
| 2007/0121388 | A1 | * | 5/2007 | Lee | 365/185.29 |
| 2008/0061334 | A1 | * | 3/2008 | Jung et al. | 257/295 |
| 2008/0087932 | A1 | * | 4/2008 | Son et al. | 257/315 |
| 2010/0055899 | A1 | * | 3/2010 | Mayer et al. | 438/666 |
| 2011/0115025 | A1 | * | 5/2011 | Okamoto | 257/368 |

FOREIGN PATENT DOCUMENTS

KR 10-2009-0007868 1/2009

* cited by examiner

*Primary Examiner* — Hoai V Ho
*Assistant Examiner* — Min Huang
(74) *Attorney, Agent, or Firm* — Marshall, Gerstein & Borun LLP (57) ABSTRACT

A semiconductor device comprises a transistor comprising a gate, a source, a drain, and a gate insulating layer, and an auxiliary line formed over the drain and electrically insulated from the drain. During a turn-off operation of the transistor, voltage to increase a resistance of the drain is supplied to the auxiliary line.

16 Claims, 6 Drawing Sheets

SEMICONDUCTOR DEVICE

CROSS-REFERENCE TO RELATED APPLICATION

This is a division of U.S. application Ser. No. 12/872,888 filed Aug. 31, 2010, which claims the priority benefit under USC 119 of KR 10-2009-0082071 filed Sep. 1, 2009, the entire respective disclosures of which are incorporated herein by reference.

BACKGROUND

Exemplary embodiments relate generally to semiconductor devices and, more particularly, to semiconductor devices capable of reducing the leakage current generated in a transistor.

A semiconductor device, such as a flash memory device, includes a memory cell array region in which memory cells for storing data are formed and a peripheral region in which circuit elements for the operation of the memory cells are formed. The flash memory device can perform data erase and write operations for the memory cells. The flash memory device uses a high voltage to perform the data erase and write operations. A high voltage transistor for transferring or switching the high voltage is formed in the peripheral region of the flash memory device.

The high voltage transistor is used for a high voltage switch, a high voltage pump, a decoder, a page buffer, and a discharge voltage transfer circuit. Further, the high voltage transistor is formed over a gate insulating layer that is thicker than a gate insulating layer formed in the memory cell array region and configured to sufficiently resist the high voltage.

However, the leakage current can be abnormally increased in the high voltage transistor because of several causes, leading to operation errors.

BRIEF SUMMARY

Exemplary embodiments relate to a semiconductor device in which an auxiliary line is formed over the drain of a high voltage transistor and wherein voltage for forming a depletion region in the drain of the high voltage transistor is supplied to the auxiliary line during a turn-off operation of the high voltage transistor, thereby being capable of reducing or eliminating the leakage current of the high voltage transistor.

A semiconductor device according to an aspect of the present disclosure comprises a transistor comprising a gate, a source, a drain, and a gate insulating layer, and an auxiliary line formed over the drain and electrically insulated from the drain. During a turn-off operation of the transistor, voltage to increase resistance of the drain is supplied to the auxiliary line.

Preferably, the resistance of the drain is increased because a depletion region is formed in the drain when voltage supplied to the auxiliary line.

The voltage supplied to the auxiliary line to increase the resistance of the drain preferably is 0 V or a negative voltage.

An interval between the drain and the auxiliary line preferably ranges in size from 30 nm to 500 nm.

The semiconductor device preferably further includes a first contact plug coupled to the source, a second contact plug coupled to the drain, a first contact line coupled to the first contact plug, and a second contact line coupled to the second contact plug.

The semiconductor device preferably further includes a first insulating layer formed over a semiconductor substrate including the transistor and a second insulating layer formed over the first insulating layer. The first contact plug and the second contact plug preferably are formed in the first insulating layer, and the first contact line and the second contact line preferably are formed in the second insulating layer.

The auxiliary line preferably is formed in the second insulating layer and preferably is coupled to a voltage supply source.

Alternatively, the auxiliary line may be formed from the inside of the second insulating layer to the inside of the first insulating layer and may be coupled to a voltage supply source. Preferably, the first insulating layer is at least as thick as the gate insulating layer remaining between the auxiliary line and the drain.

The auxiliary line preferably is formed over the second insulating layer.

The first contact line preferably is coupled to a global word line to which operating voltages are supplied, and the second contact line preferably is coupled to a local word line coupled to memory cells.

An interval between the auxiliary line and the second contact line preferably is at least 60 nm.

The auxiliary line preferably is formed between the gate and the second contact plug.

An interval between the gate and the second contact plug preferably is larger than an interval between the gate and the first contact plug.

A semiconductor device according to another aspect of this disclosure includes memory cell blocks each comprising memory cells for storing data, transistors comprising sources coupled to global word lines and drains coupled to local word lines of the memory cells constituting each of the memory cell blocks and to transfer operating voltages supplied to the global word lines to the local word lines in response to a block selection signal, and an auxiliary line formed over the drains and insulated from the drains. During an erase operation performed on a memory cell block selected from among the memory cell blocks, voltage to increase the drain resistance of each of the transistors coupled between the global word lines and the local word lines of the memory cells within unselected memory cell blocks is supplied to the auxiliary line.

The drain resistance preferably is increased because a depletion region is formed in the drain due to voltage supplied to the auxiliary line.

The voltage supplied to the auxiliary line to increase the drain resistance preferably is 0 V or a negative voltage.

An interval between the drain and the auxiliary line preferably ranges in size from 30 nm to 500 nm.

A first contact plug coupled to the sources and a first contact line coupled to the first contact plug and the global word lines preferably are formed between the sources and the global word lines, and a second contact plug coupled to the drains and a second contact line coupled to the second contact plug and the local word lines preferably are formed between the drains and the local word lines.

A gate of the transistor and the second contact plug preferably are larger than an interval between the gate of the transistor and the first contact plug.

DESCRIPTION OF EMBODIMENTS

Hereinafter, exemplary embodiments of the disclosure are described in detail with reference to the accompanying drawings. The drawing figures are provided to allow those having ordinary skill in the art to understand the scope of the exemplary embodiments of the disclosure.

Figure 1:
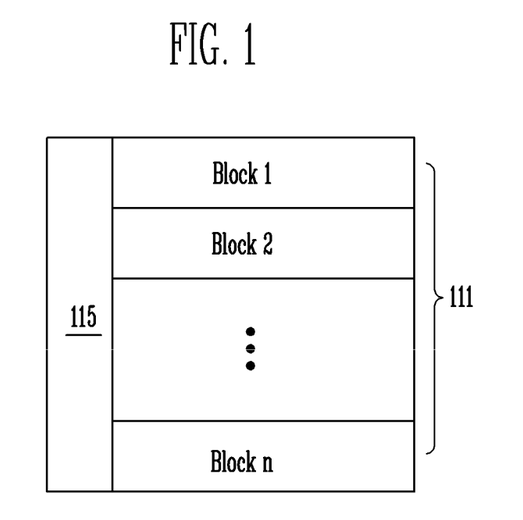
FIG. 1 is a schematic block diagram showing part of a flash memory device from among semiconductor devices.
Figure 2:
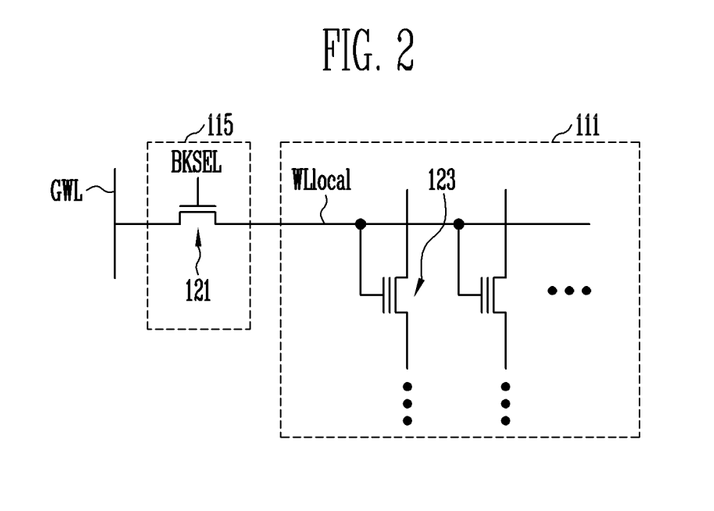
FIG. 2 is a schematic circuit diagram of the memory device shown in FIG. 1.
Figure 3:
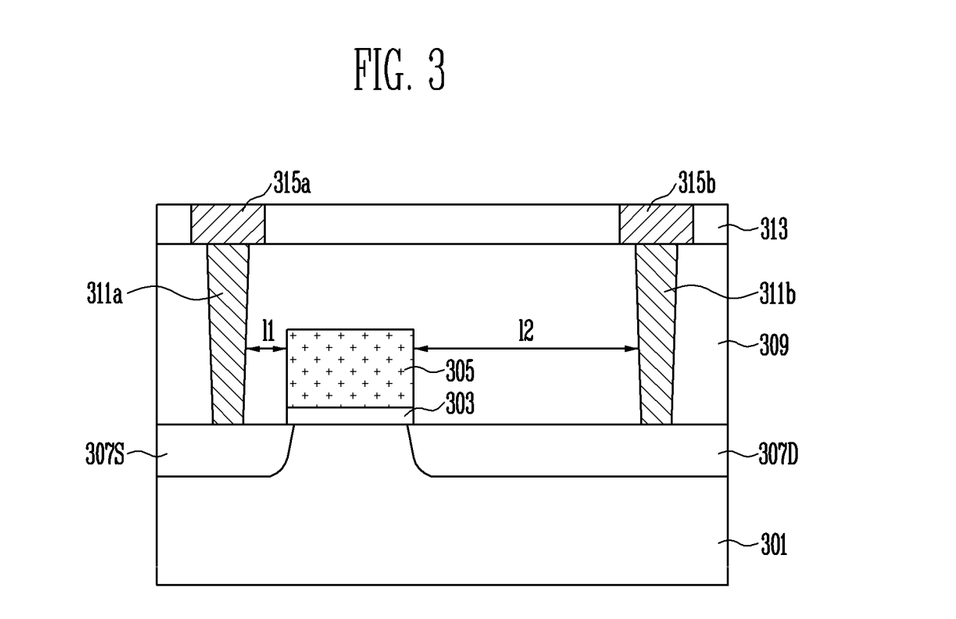
FIG. 3 is a cross-sectional view of a high voltage transistor shown in FIG. 2.

FIGS. 1 to 3 are diagrams illustrating problems resulting from leakage current generated in a high voltage transistor of a semiconductor memory device. More particularly, FIG. 1 is a schematic block diagram showing part of a flash memory device from among semiconductor devices. FIG. 2 is a schematic circuit diagram of the memory device shown in FIG. 1. FIG. 3 is a cross-sectional view of the high voltage transistor shown in FIG. 2.

The flash memory device, as shown in FIG. 1, includes a memory cell array region 111 and a block selection unit 115 formed in a peripheral region.

Referring to FIG. 2, a plurality of memory cells 123 for storing data are formed in the memory cell array region 111. The plurality of memory cells can be classified into a plurality of memory cell blocks Block 1, Block 2, ..., Block n. As shown in FIG. 2, a plurality of local word lines $WL_{local}$ are formed in the memory cell array region 111. The gates of the memory cells 123 are coupled to the local word lines $WL_{local}$.

A circuit for selecting at least one of the plurality of memory cell blocks Block 1, Block 2, ..., Block n is formed in the block selection unit 115. More particularly, as shown in FIG. 2 the block selection unit 115 includes a transistor 121 (i.e., a high voltage transistor), which is operated in response to a block selection signal BKSEL. The source of the transistor 121 is coupled to a global word line GWL, and the drain thereof is coupled to the local word line $WL_{local}$.

An erase operation of the flash memory device is performed by discharging charges, stored in the floating gate of the memory cell, to the p-well of a semiconductor substrate through Fowler-Nordheim (FN) tunneling. Such an erase operation is performed for every memory cell block Block 1, Block 2, ..., Block n.

Illustratively, to perform an erase operation on a selected memory cell block (e.g., Block 1), a bias voltage of 0 V is supplied to the global word line GWL, and a high voltage (e.g., 20 V) is supplied to the p-wells of the memory cells 123 included in the selected memory cell block Block 1. Here, the sources and drains of the memory cells 123 are in a floating state. Furthermore, the block selection signal BKSEL of a power source voltage level is supplied to the gate of the transistor 121 coupled between the local word line $WL_{local}$ of the selected memory cell block Block 1 and the global word line GWL for supplying operating voltages. Accordingly, the transistor 121 is turned on, and thus the local word line $WL_{local}$ of the selected memory cell block Block 1 and the global word line GWL are coupled together. Consequently, a voltage difference is generated between a p-well and the control gates of the memory cells 123 coupled to the local word line $WL_{local}$ of the selected memory cell block Block 1. Accordingly, charges stored in the floating gates of the memory cells 123 included in the selected memory cell block Block 1 are discharged to the p-well and the erase operation of the selected memory cell block Block 1 is thereby performed.

Meanwhile, the block selection signal BKSEL of 0 V is supplied to the gate of the transistor 121 coupled between the global word line GWL and the local word line $WL_{local}$ of unselected memory cell blocks Block 2, ..., Block n, and voltage of 0 V is illustratively supplied to the substrate of the transistor 121. Thus, the transistor 121 coupled between the global word line GWL and the local word line $WL_{local}$ of the unselected memory cell blocks Block 2, ..., Block n are turned off, and the local word line $WL_{local}$ of the unselected memory cell blocks Block 2, ..., Block n is thereby separated from the global word line GWL.

Consequently, the local word line $WL_{local}$ of the unselected memory cell blocks Block 2, ..., Block n becomes a floating state, and the high voltage supplied to the p-well is introduced into the local word line $WL_{local}$ of the unselected memory cell blocks Block 2, ..., Block n by a coupling phenomenon. Accordingly, since the voltage level of the local word line $WL_{local}$ of the unselected memory cell blocks Block 2, ..., Block n is boosted, charges are not discharged from the floating gates because a voltage difference between the memory cells 123 and the p-wells are minute in the unselected memory cell blocks Block 2, ..., Block n. Consequently, during the time for which the erase operation of the selected memory cell block Block 1 is performed, the erase operation of the unselected memory cell blocks Block 2, ..., Block n is not performed.

However, although the transistor 121 coupled between the global word line GWL and the unselected memory cell blocks Block 2, ..., Block n is turned off, the leakage current can be generated. A boosting level of the local word line $WL_{local}$ of the unselected memory cell blocks Block 2, ..., Block n can be gradually decreased by the leakage current. Consequently, a voltage difference between the control gates of the memory cells 123 and the p-wells in the unselected memory cell blocks Block 2, ..., Block n is increased, and charges stored in the memory cells 123 of the unselected memory cell blocks Block 2, ..., Block n are thereby discharged, thereby generating failure due to erase disturbance.

Meanwhile, the transistor 121, as shown in FIG. 3, includes a gate 305 formed on a gate insulating layer 303 of a semiconductor substrate 301, a source region 307S formed in the semiconductor substrate 301 on one side of the gate 305, and a drain region 307D formed in the semiconductor substrate 301 on the other side of the gate 305. The source region 307S is coupled to the global word line GWL through a first contact plug 311a, coupled to the source region 307S through a first insulating layer 309, and through a first contact line 315a coupled to the first contact plug 311a through a second insulating layer 313. Furthermore, the drain region 307D is coupled to the local word line $WL_{local}$ through a second contact plug 311b, coupled to the drain region 307D through the first insulating layer 309, and through a second contact line 315b coupled to the second contact plug 311b through the second insulating layer 313.

Even though a voltage of 0 V is supplied to the gate 305 to turn off the transistor 121, if a high voltage (e.g., 20 V) higher than a Breakdown Voltage (BV) is supplied to the drain region 307D through the local word line $WL_{local}$, a leakage current can flow from the drain region 307D to the source region 307S.

To improve the phenomenon described above, the drain region 307D can be formed to have a wider width, an interval l2 between the gate 305 and the second contact plug 311b can be wider than an interval l1 between the gate 305 and the first contact plug 311a so that a horizontal electric field formed in a horizontal direction with respect to the semiconductor substrate 301 can be reduced. However, there is a limit to the improvement of a leakage current by reducing the horizontal electric field because of an increase in the degree of integration of semiconductor memory devices.

To overcome the limitations described above, the disclosure provides a semiconductor device and a method of manufacturing the same, which are capable of improving (i.e., reducing or eliminating) the leakage current.

The semiconductor device and the method of manufacturing the same according to exemplary embodiments of the disclosure are described in detail below with reference to FIGS. 4A to 5B. In particular, in FIGS. 4A to 5B, a region in which a high voltage transistor is formed is described.

FIGS. 4A to 4E are cross-sectional views illustrating a semiconductor device and a method of manufacturing the same according to a first exemplary embodiment of this disclosure.

Figure 4A:
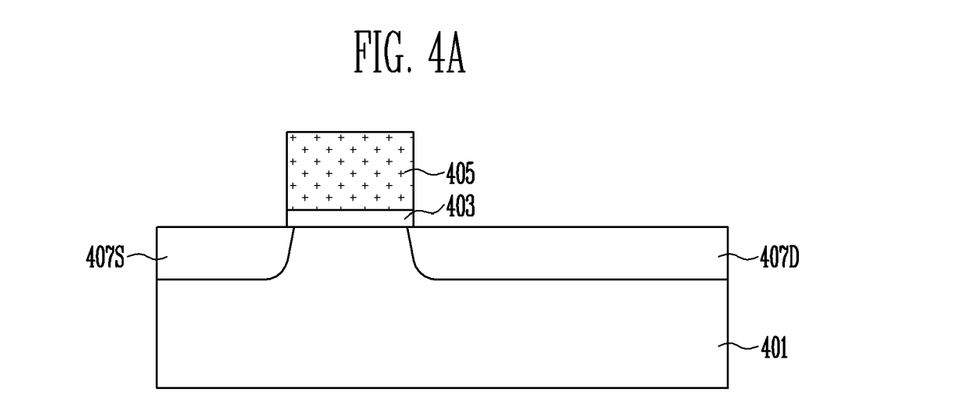
FIGS. 4A to 4E are cross-sectional views illustrating a semiconductor device and a method of manufacturing the same according to a first exemplary embodiment of the disclosure.

Referring to FIG. 4A, a gate 405 of the transistor is first formed on a gate insulating layer 403 on a semiconductor substrate 401.

The semiconductor substrate 401 includes ions for forming a well and ions for controlling the threshold voltage. Further, the gate insulating layer 403 preferably comprises an oxide layer. The gate 405 preferably comprises conductive material, highly preferably polysilicon. The gate 405 preferably is patterned using a photoresist pattern (not shown), formed using a photolithography process including exposure and development processes, as an etch barrier or can be patterned using a hard mask pattern (not shown), patterned using a photoresist pattern, as an etch barrier. The photoresist pattern and the hard mask pattern can be removed after the gate 405 is formed.

After the gate 405 is formed, junctions 407S, 407D are formed in the semiconductor substrate 401 on both sides of the gate 405 by injecting impurity ions using the gate 405 as a mask. The junctions 407S, 407D include a source region 407S formed in the semiconductor substrate 401 on one side of the gate 405 and a drain region 407D formed in the semiconductor substrate 401 on the other side of the gate 405.

Figure 4B:
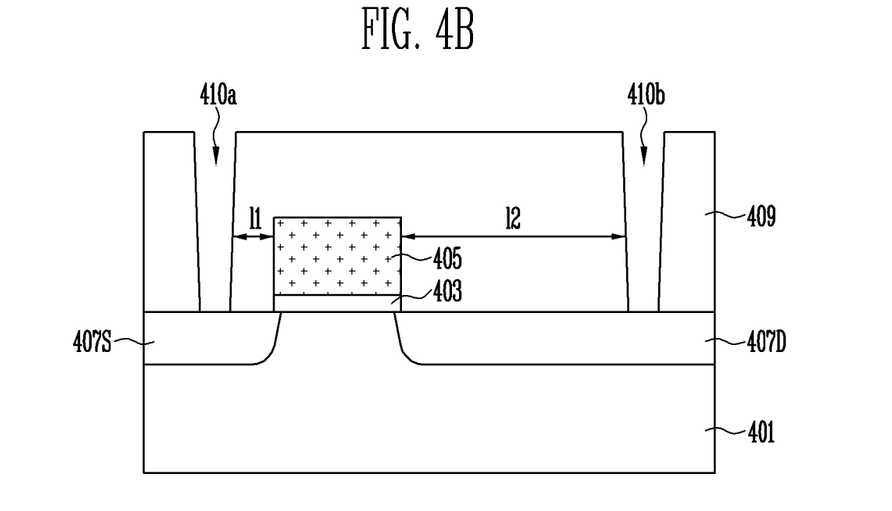

Referring to FIG. 4B, after the gate 405, the source region 407S, and the drain region 407D are formed, a first insulating layer 409 is formed over the semiconductor substrate 401. The first insulating layer 409 has a thickness sufficient to cover the gate 405 and preferably comprises an oxide layer.

After the first insulating layer 409 is formed, the first insulating layer 409 is etched by a first etch process using a photoresist pattern (not shown) or a hard mask pattern (not shown) as an etch barrier, to form a first contact hole 410a through which the source region 407S is exposed and a second contact hole 410b through which the drain region 407D is exposed. The first contact hole 410a defines a region in which a first contact plug will be formed, and the second contact hole 410b defines a region in which a second contact plug will be formed. The photoresist pattern and the hard mask pattern can be removed after the first and second contact holes 410a, 410b are formed.

Meanwhile, to improve (i.e., reduce or eliminate) currents leaking from the drain region 407D to the source region 407S by reducing a horizontal electric field formed in a horizontal direction to the semiconductor substrate 401, an interval l2 between the gate 405 and the second contact plug preferably is larger than an interval l1 between the gate 405 and the first contact plug. To this end, the interval l2 between the gate 405 and the second contact hole 410b preferably is larger than the interval l1 between the gate 405 and the first contact hole 410a.

Figure 4C:
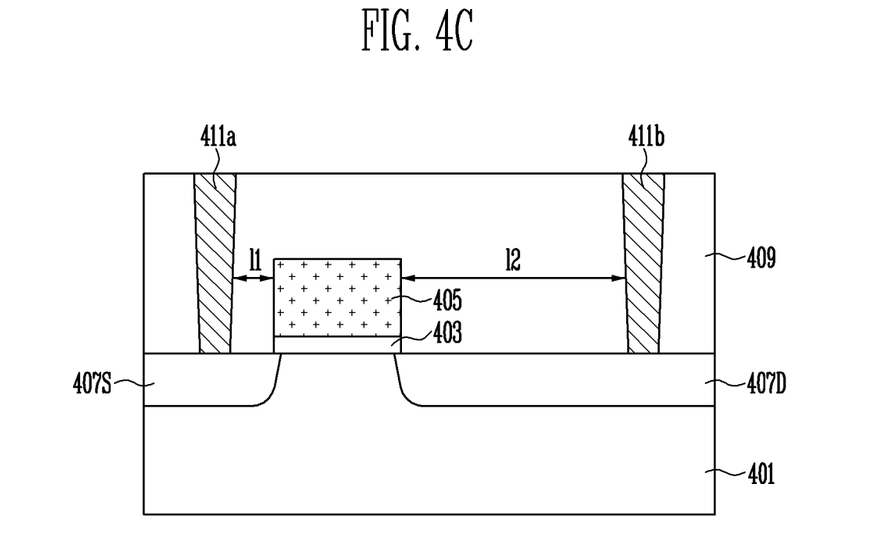

Referring to FIG. 4C, a first contact plug 411a is formed within the first contact hole 410a, and a second contact plug 411b is formed within the second contact hole 410b. Accordingly, the first contact plug 411a is coupled to the source region 407S, and the second contact plug 411b is coupled to the drain region 407D.

The first and second contact plugs 411a, 411b preferably are formed by forming a conductive material of a sufficient thickness over the first insulating layer 409, including the first and second contact holes 410a, 410b, so that the first and second contact holes 410a, 410b shown in FIG. 4B are buried and then performing a polishing process so that the first insulating layer 409 is exposed. The polishing process preferably is performed using Chemical Mechanical Polishing (CMP). The first and second contact plugs 411a, 411b are electrically insulated from each other by the first insulating layer 409.

Figure 4D:
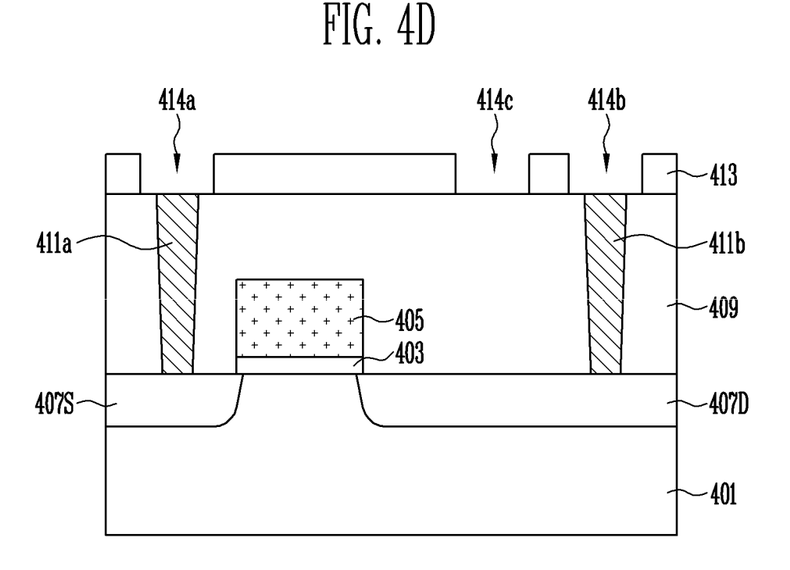

Referring to FIG. 4D, after the first and second contact plugs 411a, 411b are formed in the first insulating layer 409, a second insulating layer 413 is formed over the first insulating layer 409. The second insulating layer 413 preferably comprises an oxide layer.

After the second insulating layer 413 is formed, the second insulating layer 413 is etched by a second etch process using a photoresist pattern (not shown) or a hard mask pattern (not shown) as an etch barrier, thereby forming a first trench 414a through which the first contact plug 411a is exposed, a second trench 414b through which the second contact plug 411b is exposed, and a third trench 414c through which the first insulating layer 409 is exposed over the drain region 407D. The first trench 414a defines a region in which a first contact line will be formed, the second trench 414b defines a region in which a second contact line will be formed, and the third trench 414c defines a region in which an auxiliary line will be formed. The photoresist pattern and the hard mask pattern can be removed after the first to third trenches 414a, 414b, and 414c are formed.

Figure 4E:
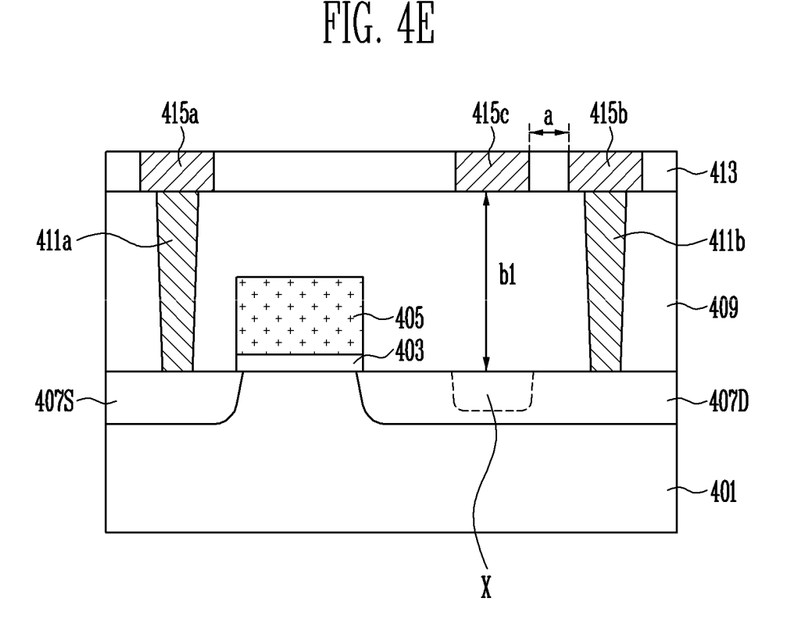

Referring to FIG. 4E, a first contact line 415a is formed within the first trench 414a, a second contact line 415b is formed within the second trench 414b, and an auxiliary line 415c is formed within the third trench 414c. Here, the first contact line 415a, the second contact line 415b, and the auxiliary line 415c are electrically insulated from one another by the second insulating layer 413.

Furthermore, the first contact line 415a is coupled to the global word line GWL shown in FIG. 2, and the second contact line 415b is coupled to the local word line $WL_{local}$ shown in FIG. 2. Accordingly, the source region 407S is coupled to the global word line GWL through the first contact line 415a and the first contact plug 411a. Further, the drain region 407D is coupled to the local word line $WL_{local}$ through the second contact line 415b and the second contact plug 411b.

Meanwhile, the auxiliary line 415c is coupled to an additional voltage supply source other than the global word line and the local word line. The auxiliary line 415c is disposed between the gate 405 and the second contact plug 411b. Furthermore, the auxiliary line 415c preferably is supplied with 0 V or a negative voltage to maximize a vertical electric field in a direction vertical to the semiconductor substrate 401 so that a depletion region X can be formed within the drain region 401D.

More particularly, in the state in which the transistor 121 is in a turn-off state by supplying 0 V to the global word line GWL (refer to FIG. 2) coupled to the source region 407S and voltage of 0 V (i.e., the block selection signal BKSEL) to the gate 405 of the transistor 121 and a high voltage has been introduced into the drain region 407D coupled to the local word line $WL_{local}$ of unselected memory cell blocks, 0 V or a negative voltage preferably is supplied to the auxiliary line 415c. In this case, a vertical electric field is formed in the direction from the drain region 407D to the auxiliary line 415c, the depletion region X is formed within the drain region 407D by the vertical electric field, and thus resistance of the drain region 407D is increased. Accordingly, the disclosure can improve (i.e., reduce or eliminate) the leakage current from the drain region 407D to the source region 407S.

Meanwhile, in the disclosure, an interval 'a' between the second contact line 415b and the auxiliary line 415c preferably is at least 60 nm by taking the process margin of exposure and development processes into consideration.

Further, an interval b1 between the auxiliary line 415c and the drain region 407D preferably is as small as possible to maximize the formation of the vertical electric field so that the depletion region X can be easily formed within the drain region 407D.

In the first exemplary embodiment of this disclosure, the auxiliary line 415c is formed in the same layer as the first and second contact lines 415a, 415b. Accordingly, the interval b1 between the auxiliary line 415c and the drain region 407D preferably is as small as possible, taking the formation margin of the first and second contact plugs 411a, 411b into consideration. Further, a thickness of the first insulating layer 409 to determine the interval b1 between the auxiliary line 415c and the drain region 407D by taking the formation margin of the first and second contact plugs 411a, 411b into consideration preferably is at least 400 nm. Furthermore, for the depletion region X to be formed, a thickness of the first insulating layer 409 between the auxiliary line 415c and the drain region 407D preferably is 500 nm or less.

The first and second contact lines 415a, 415b and the auxiliary line 415c preferably are formed by forming a conductive material of a sufficient thickness over the second insulating layer 413, including the first to third trenches 414a, 414b, and 414c, so that the first to third trenches 414a, 414b, and 414c are buried, and then performing a polishing process so that the second insulating layer 413 is exposed. The polishing process preferably is performed using Chemical Mechanical Polishing (CMP). In accordance with the fabrication method according to the first exemplary embodiment of this disclosure, the first and second contact lines 415a, 415b and the auxiliary line 415c have the same height.

Figure 5A:
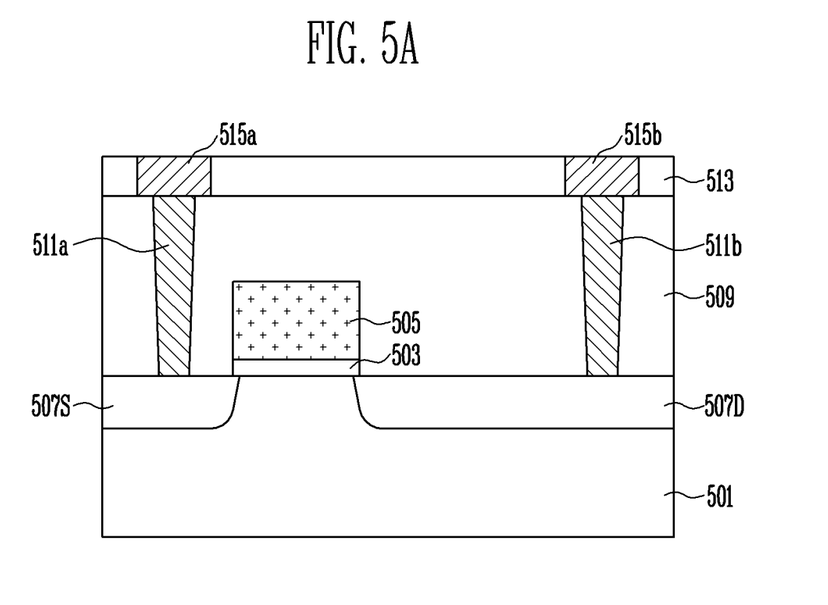
FIGS. 5A and 5B are cross-sectional views illustrating a semiconductor device and a method of manufacturing the same according to a second exemplary embodiment of the disclosure.
Figure 5B:
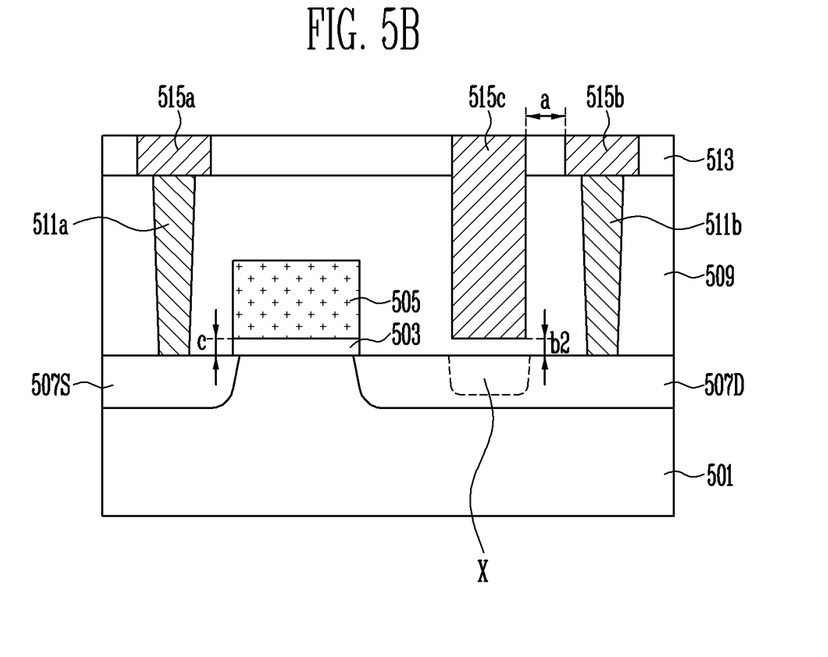

FIGS. 5A and 5B are cross-sectional views illustrating a semiconductor device and a method of manufacturing the same according to a second exemplary embodiment of the disclosure.

Referring to FIG. 5A, in the second exemplary embodiment of this disclosure, a gate insulating layer 503, a gate 505, a source region 507S, a drain region 507D, first and second contact plugs 511a, 511b, and first and second contact lines 515a, 515b are formed, illustratively using the same method as that of the first exemplary embodiment of this disclosure.

In the second exemplary embodiment of this disclosure, a third trench to define a region in which an auxiliary line will be formed is not formed simultaneously with first and second trenches to define respective regions in which the first and second contact lines 515a, 515b will be formed. Further, in the second exemplary embodiment of this disclosure, the auxiliary line is not formed simultaneously with the first and second contact lines 515a, 515b.

Referring to FIG. 5B, a second insulating layer 513 and a first insulating layer 509 formed over the drain region 507D are etched to form the third trench, defining the region in which the auxiliary line 515c will be formed is formed. Next, the auxiliary line 515c is formed within the third trench.

The third trench is formed by etching the second insulating layer 513 and the first insulating layer 509 by an etch process using a photoresist pattern (not shown) or a hard mask pattern (not shown) as an etch barrier. Here, the etch process preferably is performed such that a thickness d2 of the first insulating layer 509, remaining between the third trench and the drain region 507D, is at least the same thickness 'c' as the gate insulating layer 503. The thickness 'c' of the gate insulating layer 503 can vary according to the highest voltage level used to program a semiconductor memory cell, but is, in general, preferably 30 nm or more. Accordingly, the thickness d2 of the first insulating layer 509, remaining between the third trench and the drain region 507D, preferably is at least 30 nm.

The thickness d2 of the first insulating layer 509 remaining between the third trench and the drain region 507D is at least the same thickness as the gate insulating layer 503 because a leakage current can be prevented from occurring between the auxiliary line and the drain region when voltage from a voltage supply source is supplied to the auxiliary line, which will be subsequently formed within the third trench. The photoresist pattern and the hard mask pattern can be removed after the third trench is formed.

The auxiliary line 515c preferably is formed by forming a conductive material of a sufficient thickness over the second insulating layer 513, including the third trench, to bury the third trench and then performing polishing process so that the second insulating layer 513 is exposed. The polishing process preferably is performed using Chemical Mechanical Polishing (CMP).

It has been described above that the first and second trenches are first formed and the third trench, defining the region in which the auxiliary line will be formed, is then formed. However, the auxiliary line can be first formed within the third trench, and the first and second trenches can be then formed.

In accordance with the fabrication method according to the second exemplary embodiment of this disclosure, the auxiliary line 515c is formed within the third trench formed in the second and first insulating layers 513, 509. Accordingly, the bottom of the auxiliary line 515c is higher than the bottoms of first and second contact plugs 511a, 511b, but lower than the bottoms of the first and second contact lines 515a, 515b.

In the second exemplary embodiment of this disclosure, the interval b2 between the auxiliary line 515c and the drain region 507D preferably is as small as possible because the auxiliary line 515c is formed by an additional etch process. Accordingly, since the formation of a vertical electric field can be maximized, a depletion region X can be formed more easily and thus the leakage current can be minimized.

Figure 6:
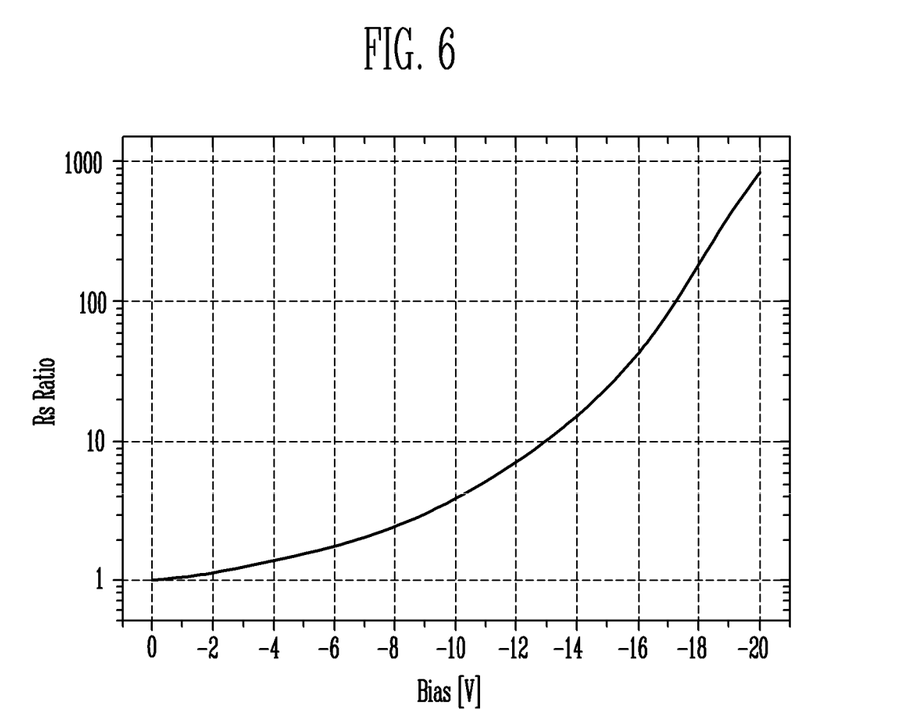
FIG. 6 is a graph showing monitored resistances of a junction according to biases supplied to an auxiliary line.

FIG. 6 is a graph showing monitored resistances of a junction according to biases supplied to the auxiliary line.

From FIG. 6, it can be seen that with an increase of a negative bias supplied to the auxiliary line, resistance of the junction (i.e., resistance of the drain region) is increased. Such a phenomenon is generated because, when voltage of 0 V or less is supplied to the auxiliary line, depletion is generated in the drain region and the depletion is increased with an increase of the negative bias supplied to the auxiliary line.

As described above, in the present embodiment, the auxiliary line insulated from the drain region is formed over the drain region. Accordingly, a vertical electric field can be formed in the direction from the drain region to the auxiliary line. The device and method of the disclosure can increase resistance of the drain region because the depletion region can be formed in the drain region by the above vertical electric field. Accordingly, the device and method of the disclosure can improve (i.e., reduce or eliminate) the leakage current in the transistor.

Meanwhile, the transistor coupled between the global word line and the local word line of the flash memory device has been described as an example. The disclosure is not limited to this example, but can be applied to other regions within a memory chip using a high voltage transistor or to non-memory devices in order to improve the leakage current. Furthermore, the auxiliary line may not be formed in the second insulating layer or in the second and first insulating layers, but formed over the second insulating layer by an additional patterning process.

In accordance with the disclosure, the auxiliary line insulated from the drain region is formed over the drain region. Accordingly, a vertical electric field can be formed in the direction from the drain region to the auxiliary line. Further, the device and method of the disclosure can increase resistance of the drain region because the depletion region can be formed in the drain region by the above vertical electric field. Accordingly, the device and method of the disclosure can improve (i.e., reduce or eliminate) the leakage current in the transistor.

What is claimed is:

1. A semiconductor device, comprising:
   a semiconductor substrate including a peripheral region and a memory cell array region;
   a memory cell block formed in the memory cell array region;
   a gate insulating layer formed on the semiconductor substrate in the peripheral region;
   a gate having two sides formed on the gate insulating layer;
   a source region and a drain region formed in the semiconductor substrate on both sides of the gate;
   a first line coupled to the source region;
   a second line coupled to the drain region and the memory cell block; and
   an auxiliary line formed over the drain region,
   wherein an entire width of the auxiliary line overlaps the drain region.

2. The semiconductor device of claim 1, wherein a resistance of the drain region is increased due to a depletion region formed in the drain region when a voltage is supplied to the auxiliary line.

3. The semiconductor device of claim 2, wherein the voltage supplied to the auxiliary line to increase the resistance of the drain region is 0 V or a negative voltage.

4. The semiconductor device of claim 1, wherein an interval between the drain region and the auxiliary line ranges in size from 30 nm to 500 nm.

5. The semiconductor device of claim 1, further comprising:
   a first contact plug formed between the source and the first line; and
   a second contact plug formed between the drain region and the second line.

6. The semiconductor device of claim 5, wherein an interval between the gate and the second contact plug is larger than an interval between the gate and the first contact plug.

7. The semiconductor device of claim 5, further comprising:
   a first insulating layer formed over a semiconductor substrate to cover the gate; and
   a second insulating layer formed over the first insulating layer,
   wherein the first contact plug and the second contact plug pass through the first insulating layer,
   wherein the first line and the second contact line pass through the second insulating layer.

8. The semiconductor device of claim 7, wherein the auxiliary line passes through the second insulating layer and is coupled to a voltage supply source.

9. The semiconductor device of claim 7, wherein the auxiliary line passes through the second insulating layer and a part of the first insulating layer and is coupled to a voltage supply source.

10. The semiconductor device of claim 9, wherein the first insulating layer remaining between the auxiliary line and the drain region is at least as thick as the gate insulating layer.

11. The semiconductor device of claim 7, wherein the auxiliary line is formed over the second insulating layer.

12. The semiconductor device of claim 5, wherein an interval between the auxiliary line and the second contact line is at least 60 nm in size.

13. The semiconductor device of claim 5, wherein the auxiliary line is formed between the gate and the second contact plug.

14. A semiconductor device, comprising:
    global word lines each supplied with an operating voltage;
    memory cell blocks each comprising memory cells controlled by the operating voltage;
    local word lines coupled to each of the memory cell blocks;
    transistors each comprising a source coupled to the global word line and a drain coupled to local word line, and to transfer the operating voltage supplied to the global word line to the local word line in response to the block selection signal;
    an auxiliary line formed over the drain; a first contact plug coupled to the source; and
    a second contact plug coupled to the drain,
    wherein an interval between the gate and the second contact plug is larger than an interval between the gate and the first contact plug.

15. The semiconductor device of claim 14, wherein during an erase operation performed on a memory cell block selected from among the memory cell blocks, voltage to increase a drain resistance of each of the transistors coupled between the global word lines and the local word lines of the memory cells within unselected memory cell blocks is supplied to the auxiliary line.

16. The semiconductor device of claim 1, wherein during an erase operation performed on the memory cell block, a voltage to increase a resistance of the drain region is supplied to the auxiliary line.

* * * * *